(12) United States Patent
Morimoto

(10) Patent No.: US 10,067,742 B2
(45) Date of Patent: Sep. 4, 2018

(54) PROGRAMMABLE LOGIC DEVICE, METHOD FOR VERIFYING ERROR OF PROGRAMMABLE LOGIC DEVICE, AND METHOD FOR FORMING CIRCUIT OF PROGRAMMABLE LOGIC DEVICE

(71) Applicant: Control System Laboratory, Ltd., Kanagawa (JP)

(72) Inventor: Kenichi Morimoto, Kanagawa (JP)

(73) Assignee: Control System Laboratory Ltd., Kanagawa (JP)

( * ) Notice: Subject to any disclaimer, the term of this patent is extended or adjusted under 35 U.S.C. 154(b) by 0 days.

(21) Appl. No.: 15/572,140

(22) PCT Filed: Feb. 24, 2016

(86) PCT No.: PCT/JP2016/055389
§ 371 (c)(1),
(2) Date: Nov. 6, 2017

(87) PCT Pub. No.: WO2016/178332
PCT Pub. Date: Nov. 10, 2016

(65) Prior Publication Data
US 2018/0129471 A1    May 10, 2018

(30) Foreign Application Priority Data

May 7, 2015    (JP) ................ 2015-094970

(51) Int. Cl.
*G06F 13/00*    (2006.01)
*G06F 7/02*    (2006.01)
(Continued)

(52) U.S. Cl.
CPC ............... *G06F 7/02* (2013.01); *G06F 7/483* (2013.01); *H03K 19/173* (2013.01)

(58) Field of Classification Search
CPC .......... G06F 7/02; G06F 7/483; H03K 19/173
(Continued)

(56) References Cited

U.S. PATENT DOCUMENTS

2012/0047354 A1* 2/2012 Shimizu ................ G06F 17/243
712/221
2012/0124379 A1* 5/2012 Teranishi .............. H04L 9/3218
713/175
(Continued)

FOREIGN PATENT DOCUMENTS

JP    2001099627 A    4/2001
JP    2011216020 A    10/2011

*Primary Examiner* — Tan V. Mai
(74) *Attorney, Agent, or Firm* — Fox Rothschild LLP; Robert J. Sacco; Carol E. Thorstad-Forsyth

(57) ABSTRACT

Arithmetic operation circuits and a verification circuit are formed by loading configuration information into a configuration memory in an FPGA. Arithmetic operation circuits have the same arithmetic operation function, but are different from each other in combination of the circuit blocks. The arithmetic operation circuits are formed by combining the circuit blocks to make the maximum use of the DSP block, while the arithmetic operation circuit is formed by combining the circuit blocks other than DSP block. The arithmetic operation circuits each are configured to use a block RAM as the data hold memory, while the arithmetic operation circuit is configured to use a distributed RAM as the data hold memory. Each of the arithmetic operation circuits receives the input data, and outputs arithmetic operation result data (V1 to V3). A verification circuit compares the arithmetic operation result data to verify whether errors occur.

3 Claims, 6 Drawing Sheets

(51) Int. Cl.
*H03K 19/173* (2006.01)
*G06F 7/483* (2006.01)

(58) Field of Classification Search
USPC .......................................................... 708/164
See application file for complete search history.

(56) References Cited

U.S. PATENT DOCUMENTS

2012/0191286 A1\* 7/2012 Bouwman ................ B62D 1/28
 701/25
2014/0237263 A1\* 8/2014 Suzuki ................ G06F 12/1408
 713/193
2017/0060462 A1\* 3/2017 Fukuda .................. G06F 1/3296

\* cited by examiner

PROGRAMMABLE LOGIC DEVICE, METHOD FOR VERIFYING ERROR OF PROGRAMMABLE LOGIC DEVICE, AND METHOD FOR FORMING CIRCUIT OF PROGRAMMABLE LOGIC DEVICE

CROSS REFERENCE TO RELATED APPLICATION

The present application claims benefit of International Patent Application (PCT) No. PCT/JP2016/055389 filed on Feb. 24, 2016, which claims priority to Japanese Patent Application No. 2015-094970 filed on May 7, 2015. Both of the aforementioned applications are incorporated herein by reference in their entireties.

TECHNICAL FIELD

The present invention relates to a programmable logic device, a method for verifying an error of the programmable logic device, and a method for forming a circuit of the programmable logic device.

BACKGROUND ART

In recent years, programmable logic devices, especially FPGAs (Field Programmable Gate Arrays) have been frequently used in control and communication fields. The FPGA includes an arithmetic operation circuit formed by combining circuit blocks such as basic logic blocks (also referred to as CLBs (Configurable Logic Blocks), LEs (Logic Elements) or the like) in accordance with configuration information loaded into a configuration memory in the FPGA. The FPGA can form various arithmetic operation circuits ranging from a circuit performing a simple numerical operation to a circuit having a function equivalent to a CPU (Central Processing Unit) (for example, see Patent Literature 1).

In the FPGA, one arithmetic operation for achieving the arithmetic operation function is performed by one corresponding circuit block, and various arithmetic operation functions are provided by changing a combination of the circuit blocks. Thus, in the FPGA, as the number of arithmetic operations of the arithmetic operation functions is increased, the number of circuit blocks used in the arithmetic operation circuit is increased. As a result, a complex arithmetic operation circuit with many circuit blocks is formed in the FPGA. This results in increasing the number of circuit elements such as an AND gate, and an OR gate in the circuit block that is used in the arithmetic operation circuit as the number of circuit blocks used in the arithmetic operation circuit is increased.

The circuit elements such as an AND gate, and an OR gate may cause malfunctions due to charged particles or the like in the atmosphere. In a case where the circuit elements incorporated into the arithmetic operation circuit malfunction, for example, the arithmetic operation result of the arithmetic operation circuit is in error. Thus, in the FPGA, as the number of circuit elements used in the arithmetic operation circuit is increased, the probability of being influenced by the charged particles or the like in the atmosphere becomes correspondingly higher, and the possibility of occurrence of an error becomes higher.

In the above-described FPGA, it is known that robustness with respect to the fluctuation of a clock for driving the FPGA, the voltage fluctuation of a voltage source of the FPGA and the temperature fluctuation of the FPGA itself is influenced by a state of route connecting between circuit blocks (connection state), for example, and an error may occur easily depending on the connection state between the circuit blocks included in the arithmetic operation circuit.

Conventionally, it is considered that arithmetic operation circuits each being formed by combining the same type of circuit blocks to perform the same arithmetic processing are provided in duplicate or triplicate form in the FPGA, and thus redundant arithmetic operation circuits simultaneously perform the same arithmetic operation to perform an error verification method for comparing the arithmetic operation results of the arithmetic operation circuits to verify whether a malfunction of the circuit block is caused in any of arithmetic operation circuits, or whether an error occurs in the result of the arithmetic operation.

CITATION LIST

Patent Literature

Patent Literature 1: Japanese Patent Laid-Open No. 2001-099627

SUMMARY OF INVENTION

Technical Problem

In the conventional error verification method, a plurality of arithmetic operation circuits are made redundant each by combining the same type of circuit blocks to perform the same arithmetic processing. Therefore, in a case where errors occur caused by factors common to the entire FPGA (hereinafter referred to as "common factors") such as the temperature fluctuation of the FPGA itself, the voltage fluctuation of the voltage source of the FPGA, and the fluctuation of a clock for driving the FPGA, the same result of the arithmetic operation is obtained despite the fact that an error occurs in the result of the arithmetic operation obtained from each arithmetic operation circuit in the FPGA, resulting in no detection of the error occurrence in some cases. Accordingly, the conventional error verification method is not considered providing a very high error detection rate.

The present invention has been made in view of the above problems, and an object of the present invention is to provide a programmable logic device capable of improving an error detection rate more than in the conventional devices, a method for verifying an error of the programmable logic device, and a method for forming a circuit of the programmable logic device.

Solution to Problem

The present invention provides a programmable logic device capable of changing an arithmetic operation function by changing a combination of a plurality of circuit blocks that includes: a first arithmetic operation circuit and a second arithmetic operation circuit that are different from each other in combination and connection states of the circuit blocks, and both perform the same arithmetic operation; and an output section that is provided in each of the first arithmetic operation circuit and the second arithmetic operation circuit, and outputs arithmetic operation results of the first arithmetic operation circuit and the second arithmetic operation circuit to a verification circuit that verifies the arithmetic operation results.

The present invention provides a method for verifying an error of a programmable logic device capable of changing an arithmetic operation function by changing a combination of a plurality of circuit blocks that includes: a circuit forming step of forming a first arithmetic operation circuit and a second arithmetic operation circuit that are different from each other in combination and connection states of the circuit blocks, and both perform the same arithmetic operation; an arithmetic operation step of performing an arithmetic operation by each of the first arithmetic operation circuit and the second arithmetic operation circuit; and a verification step of verifying arithmetic operation results from the first arithmetic operation circuit and the second arithmetic operation circuit.

The present invention provides a method for forming a circuit of a programmable logic device capable of changing an arithmetic operation function by changing a combination of a plurality of circuit blocks in accordance with configuration information that includes: a synthesis-parameter setting step of sequentially setting synthesis parameters that are different in condition regarding the combination of the circuit blocks; a logic synthesis step of performing logic synthesis under the set synthesis parameter each time the synthesis parameter is set in the synthesis-parameter setting step to generate a plurality of net lists corresponding to a plurality of arithmetic operation circuits from the same arithmetic operation circuit description information described in a hardware description language; a configuration information generating step of generating configuration information from the plurality of net lists; and a forming step of writing the configuration information into the programmable logic device to form, in the programmable logic device, a first arithmetic operation circuit and a second arithmetic operation circuit that are different from each other in combination and connection states of the circuit blocks in accordance with the plurality of net lists, and both perform the same arithmetic operation, and an output section that is provided in each of the first arithmetic operation circuit and the second arithmetic operation circuit so that arithmetic operation results of the first arithmetic operation circuit and the second arithmetic operation circuit are output to a verification circuit that verifies the arithmetic operation results.

Advantageous Effects of Invention

According to a programmable logic device and a method for verifying an error of the programmable logic device of the present invention, an operating state in each arithmetic operation circuit with respect to common factors such as the temperature fluctuation, the voltage fluctuation and the clock fluctuation varies depending on a combination of the circuit blocks, and an error occurrence state in each arithmetic operation circuit also varies. As compared with a case of comparing arithmetic results obtained from a plurality of conventional simply redundant arithmetic operation circuits, the errors caused by the common factors can be detected when arithmetic results obtained from the arithmetic operation circuits are compared in the present invention, thereby improving the error detection rate more than in the conventional devices.

According to a method for forming a circuit of the programmable logic device of the present invention, a plurality of arithmetic operation circuits that have the same arithmetic operation function and are different in combination of the circuit blocks can be formed in the programmable logic device by applying the configuration information generated from the plurality of net lists to the programmable logic device. Thus, in the programmable logic device to which the above-described configuration information is applied, an operating state in each arithmetic operation circuit with respect to common factors such as the temperature fluctuation, the voltage fluctuation and the clock fluctuation varies depending on a combination of the circuit blocks, and an error occurrence state in each arithmetic operation circuit also varies. As compared with a case of comparing arithmetic results obtained from a plurality of conventional simply redundant arithmetic operation circuits, the errors caused by the common factors can be detected when arithmetic results obtained from the arithmetic operation circuits are compared in the present invention, thereby improving the error detection rate more than in the conventional devices.

DESCRIPTION OF EMBODIMENT

Figure 1:
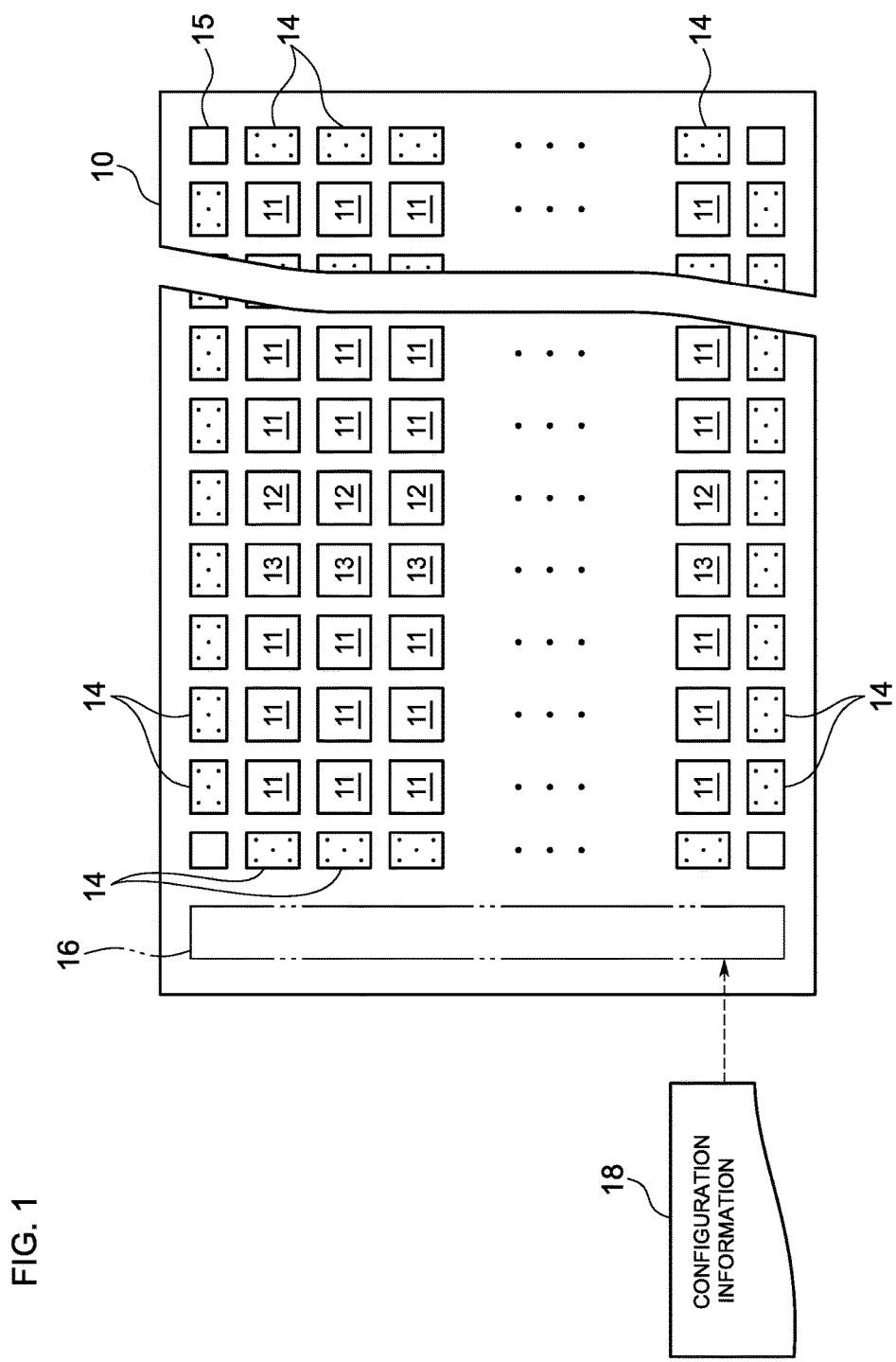
FIG. 1 is an explanation diagram illustrating an outline of an FPGA.

FIG. 1 illustrates an FPGA (Field Programmable Gate Array) 10 used in the present embodiment. The present embodiment describes a case where the present invention is applied to the general FPGA 10 as an example of a programmable logic device (PLD). The FPGA 10 is a device capable of changing arithmetic operation functions such as a communication processing function, an encryption processing function, and an image processing function. The FPGA 10 includes circuit blocks (circuit elements) such as basic logic blocks 11, DSP blocks 12, block RAMS 13, IO blocks (Input/Output Blocks) 14, and PLL blocks 15 to provide the desired arithmetic operation functions in accordance with types of signals to be subjected to arithmetic processing and contents of the arithmetic processing. The FPGA 10 includes a configuration memory 16, and routing resources (not illustrated) for connecting between circuit blocks, in addition to the circuit blocks.

The basic logic block 11 is a basic circuit block included in the FPGA 10, and is referred to as a CLB (Configurable Logic Block), a logic element (Logic Element), a logic cell (Logic Cell), or the like. There are the basic logic blocks 11 of various configurations. The basic logic block 11 generally includes a plurality of basic circuits (may be also referred to as slices, or the like) each including an LUT (Lookup table) and a register (flip-flop) as basic elements.

The DSP block 12 is not formed by combining the basic logic blocks 11, but is a circuit block previously incorporated as hardware (hard macro) to perform arithmetic operations such as a multiplication operation, and a product-sum operation at high speed, and may be referred to as a DSP slice 12 or the like. The DSP block 12 includes the high speed multiplier and adder as basic elements. The block RAM 13 is a circuit block usable as a general memory. The block RAM 13 is used to temporarily hold data under arithmetic operation that is output from the other circuit block, for example. The IO block 14 is a circuit block that provides an input function and an output function of the FPGA 10. The PLL block 15 generates a clock required for a circuit block operation. The routing resource includes a route connecting between the circuit blocks, and a pass transistor provided on the route.

Configuration information 18 is loaded (written) into the configuration memory 16. The configuration information 18 defines the circuit block operation, the connection between the circuit blocks by the routing resource, and the like, and is referred to as configuration data, a bit stream, or the like. In the FPGA 10, a desired arithmetic operation circuit is formed in accordance with the configuration information 18. That is, the FPGA 10 is a device in which a combination of a plurality of circuit blocks is changed in accordance with the configuration information 18, thereby capable of changing the arithmetic operation functions.

Figure 2:
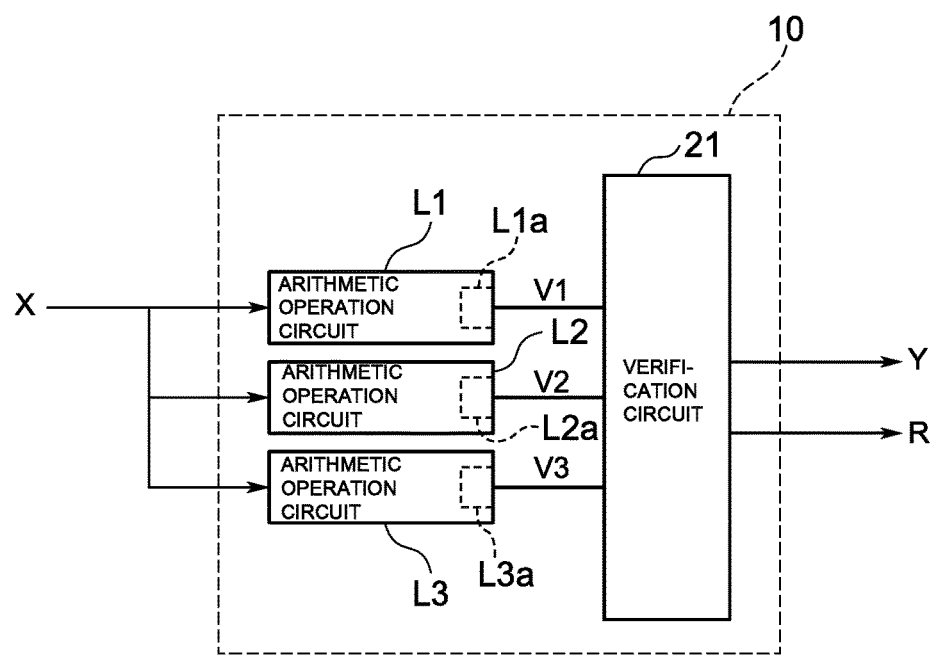
FIG. 2 is a block diagram illustrating a configuration of circuits formed in the FPGA.

In the FPGA 10, when the configuration information 18 for forming the plurality of arithmetic operation circuits having the same arithmetic operation function and being different in combination and connection states of the circuit blocks is loaded into the configuration memory 16, arithmetic operation circuits L1 to L3 and a verification circuit 21, for example, are formed in accordance with the configuration information 18 as illustrated in FIG. 2. That is, at least a first arithmetic operation circuit and a second arithmetic operation circuit are formed in the FPGA 10. Output sections L1a to L3a are formed in the arithmetic operation circuits L1 to L3, respectively, the output sections L1a to L3a outputting the arithmetic operation results of the corresponding arithmetic operation circuits to the verification circuit 21 that verifies the arithmetic operation results. Note that the present embodiment describes a configuration in which the three arithmetic operation circuits L1 to L3 are formed, but the number of arithmetic operation circuits may be two or more. The configuration information 18 may be loaded into the configuration memory 16 from an external computer, or may be automatically loaded from a nonvolatile memory into which the configuration information 18 is previously written.

As illustrated in FIG. 2, input data X ($x_1$ to $x_p$) of p-bit ($p \geq 1$) is input to the FPGA 10 in the present embodiment. It will be described a case where the FPGA 10 is provided in a control system that controls the operation of an apparatus (not illustrated), and a detection value or the like from a sensor (not illustrated) that monitors the operation of the apparatus is input to the FPGA 10 as the input data X, for example. Note that the input data X is not limited to data representing one value. For example, a plurality of detection values may be collectively regarded as the input data X. In this case, a sum of the number of bits of the plurality of detection values is p-bit. The input data X may be, for example, one set or a plurality of sets of numerical values generated by a computer or the like, data received through network, or a timing signal that controls the drive of various apparatuses.

The above-described input data X is input to each of the arithmetic operation circuits L1 to L3 in the FPGA 10. When the input data X is input to the arithmetic operation circuit L1, the arithmetic operation circuit L1 performs a predetermined arithmetic operation, and outputs arithmetic operation result data V1 ($v_{11}$ to $v_q$) of q-bit ($q \geq 1$). When the input data X is input to each of the arithmetic operation circuits L2, L3, the arithmetic operation circuits L2, L3 also perform the predetermined arithmetic operation, and output arithmetic operation result data V2 ($v_{21}$ to $v_{2q}$) and V3 ($v_{31}$ to $v_{3q}$), respectively.

The arithmetic operation circuits L1 to L3 have the same arithmetic operation function, but are different from each other in combination and connection states of the circuit blocks to improve the error detection rate. In other words, the arithmetic operation circuits L1 to L3 are different from each other in the type and the number of circuit blocks used, how to use an LUT and a register in the circuit block, and the connection state between the circuit blocks, but the arithmetic operation circuits L1 to L3 are configured to output the same arithmetic operation result data V1 to V3, respectively, in response to the input of the same input data X in a state where no error is generated in the arithmetic operation circuits L1 to L3. The arithmetic operation circuits L1 to L3 are mutually in the relationship between the first arithmetic operation circuit and the second arithmetic operation circuit from the viewpoint that they are different from each other in combination and connection states of the circuit blocks.

As described above, the arithmetic operation circuits L1 to L3 are formed different in combination of the circuit blocks to reduce a possibility of simultaneous occurrence of errors in the arithmetic operation circuits L1 to L3, and to extremely reduce a possibility that the arithmetic operation result data V1 to V3 are the same even if errors simultaneously occur in the arithmetic operation circuits L1 to L3.

For example, the arithmetic operation circuits L1, L3 each have a circuit configuration in which at least one DSP block 12 is included in a combination of the plurality of circuit blocks. On the other hand, the arithmetic operation circuit L2 has a circuit configuration in which the circuit blocks other than the DSP block 12 are combined (for example, a circuit configuration mainly including the basic logic blocks 11 including the LUT). The arithmetic operation circuits L1, L3 are equivalent to the first arithmetic operation circuit, and the arithmetic operation circuit L2 is equivalent to the second arithmetic operation circuit from the viewpoint whether or not the circuit configuration of the arithmetic operation circuit includes the DSP block 12. The arithmetic operation circuit L1 and the arithmetic operation circuit L2 each are formed by combining the circuit blocks to use the block RAM 13 as, for example, a memory holding the data under arithmetic operation (hereinafter referred to as a "data hold memory"), while the arithmetic operation circuit L3 is formed by combining the circuit blocks to use so-called distributed RAM using a flip-flop of the basic logic block 11. In this way, the arithmetic operation circuits L1 to L3 are different from each other in combination of the circuit blocks by using different types of circuit blocks, thereby providing diversity.

A case where the DSP block 12 is used as in the arithmetic operation circuits L1, L3 is different from a case where the DSP block 12 is not used as in the arithmetic operation circuit L2 in that: the number of the basic logic blocks 11 to be used can be significantly reduced; and a length of route connecting between the circuit blocks and a combination of the circuit blocks 11 forming the arithmetic operation circuit can be greatly changed. That is, the arithmetic operation circuits L1, L3 and the arithmetic operation circuit L2 have the same logic arithmetic operation function, but are greatly different in operations in the gate level (a physical process of signal processing, behavior in elements in the physical property level, and the like), and therefore are greatly different in influence of the common factors such as the temperature fluctuation, the voltage fluctuation, and the clock fluctuation of the FPGA 10 on the operations in the gate level. Since in the FPGA 10, the operation state in the gate level with respect to the common factors is greatly different between the arithmetic operation circuits L1, L3 and the arithmetic operation circuit L2, it can be expected that the degree of noncoincidence between the arithmetic operation result data becomes larger when an error occurs. Accordingly, changing the combination of the circuit blocks 11 depending on the use of the DSP block 12 is extremely advantageous in that the error occurrence is detected by noncoincidence between the arithmetic operation result data.

In the present embodiment, the verification circuit 21 is formed by combining the plurality of circuit blocks in the FPGA 10. The output sections L1a to L3a of the arithmetic operation circuits L1 to L3 send the corresponding arithmetic operation result data V1 to V3 to the verification circuit 21. The verification circuit 21 verifies the arithmetic operation result data V1 to V3, and generates verification data R as the verification results. In the case of estimating that no error occurs in the arithmetic operation result data V1 to V3, the verification circuit 21 generates output data Y ($y_1$ to $y_q$) as the arithmetic operation result data. The verification circuit 21 outputs the verification data R and the output data Y to a system controller of the control system (not illustrated).

The verification circuit 21 determines the output data Y according to, for example, a majority method. In other words, the verification circuit 21 compares values of the arithmetic operation result data V1 to V3, and determines whether they coincide with each other. The verification circuit 21 regards the arithmetic operation result data with the largest number of arithmetic operation results data having the same value as a normal value, and outputs the normal value as the output data Y.

In the FPGA 10, the arithmetic operation result data V1 to V3 obtained from the respective arithmetic operation circuits L1 to L3 are all coincident with each other in case no error occurs in any of the arithmetic operation circuits L1 to L3, for example. The arithmetic operation result data V2, V3 obtained from the respective arithmetic operation circuits L2, L3 are different from the arithmetic operation result data V1 obtained from the arithmetic operation circuit L1 in case an error occurs in only the arithmetic operation circuit L1 among the arithmetic operation circuits L1 to L3, for example. The arithmetic operation result data V2, V3 obtained from the respective arithmetic operation circuits L2, L3 are different from the arithmetic operation result data V1 obtained from the arithmetic operation circuit L1 in case errors occur in only the arithmetic operation circuits L2, L3 among the arithmetic operation circuits L1 to L3, for example.

The FPGA 10 has a circuit configuration in which the arithmetic operation circuits L1 to L3 are different from each other in combination of the circuit blocks as described above, so that the arithmetic operation result data V1 to V3 obtained from the respective arithmetic operation circuits L1 to L3 are different from each other because the operation state with respect to common factors such as the temperature fluctuation, the voltage fluctuation, and the clock fluctuation is different among the arithmetic operation circuits L1 to L3 even when errors occur caused by the common factors.

The FPGA 10 can determines that no error occurs in the FPGA 10 when the arithmetic operation result data V1 to V3 obtained from the respective arithmetic operation circuits L1 to L3 are all coincident with each other, while the FPGA 10 can determine that an error occurs when the arithmetic operation result data V1 to V3 obtained from the respective arithmetic operation circuits L1 to L3 are not coincident.

The verification data R is information to be an index for determining the error occurrence state and the accuracy of the output data Y. In the present embodiment, the verification data R includes individual verification data R1 to R3 corresponding to the arithmetic operation result data V1 to V3. In case the output data Y is regarded as the normal value, for example, the individual verification data R1 to R3 have information about the number of error bits and the positions of the error bits in the corresponding arithmetic operation result data V1 to V3, a difference between a value indicated in the output data Y and each of the arithmetic operation result data, and the like. The system controller can obtain information about the number of arithmetic operation result data that are not coincident with the normal value, the number of bits in the arithmetic operation result data that is not coincident with the normal value, the arithmetic operation circuit that is estimated that an error occurs, a difference between the normal value and a value of the arithmetic operation result data that is not coincident with the normal value, and a maximum value, a minimum value, a width of the difference, and the like based on the verification data R including the individual verification data R1 to R3.

Figure 3:
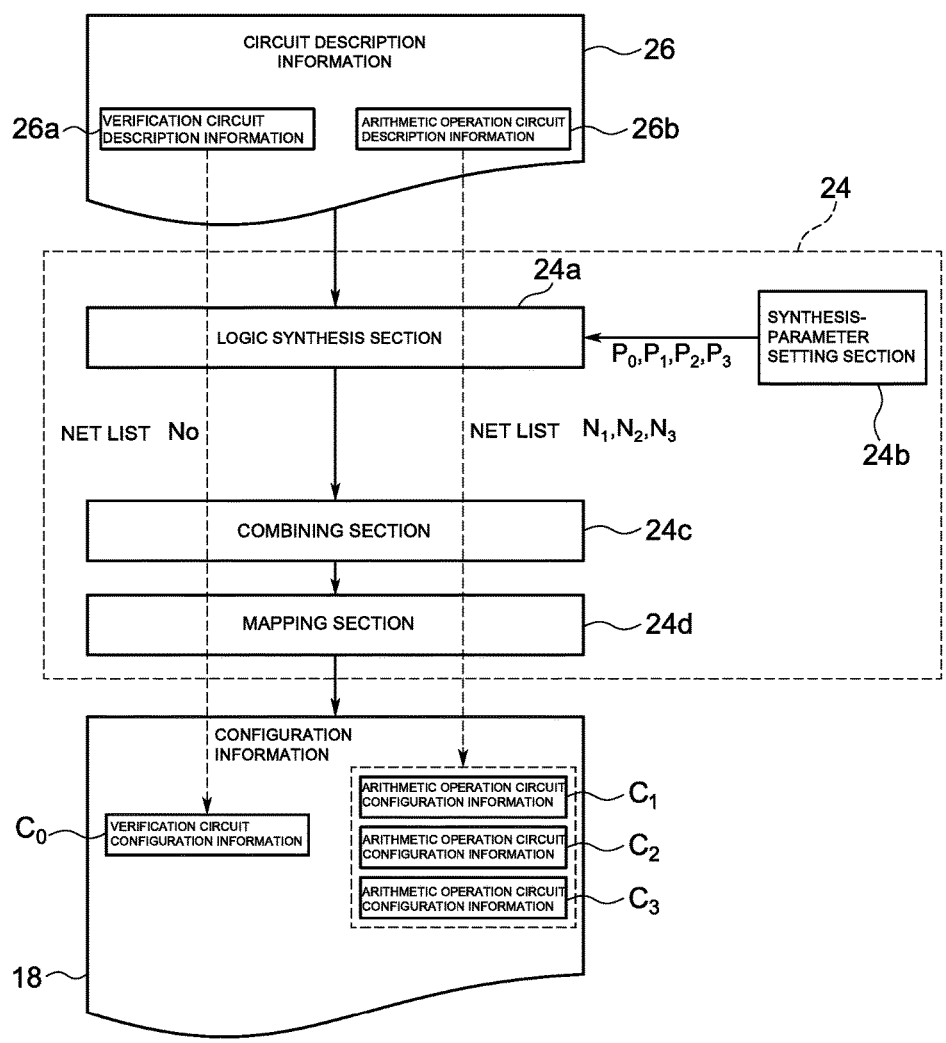
FIG. 3 is a block diagram illustrating an outline of a configuration information generating device.

As illustrated in FIG. 3, the configuration information 18 to be loaded into the FPGA 10 is generated by a configuration information generating device 24. The configuration information generating device 24 generates the configuration information 18 from circuit description information 26. The circuit description information 26 is information about specifications of the arithmetic operation functions abstracted at a register transfer level (RTL) that are described with a hardware description language (HDL). In the present embodiment, the circuit description information 26 includes verification circuit description information 26a that is described corresponding to the verification circuit 21, and arithmetic operation circuit description information 26b, and the arithmetic operation circuit description information 26b is used commonly for the plurality of arithmetic operation circuits L1 to L3 (see FIG. 2). Note that the circuit description information 26 may be generated at the register transfer level by performing the high-level synthesis of hardware description information in the behavioral level with higher abstraction degree, the hardware description information being described with an FBD (Function Block Diagram) language or the like used as an industrial application.

The configuration information generating device 24 includes a logic synthesis section 24a, a synthesis-parameter setting section 24b, a combining section 24c, and a mapping section 24d. For example, the logic synthesis section 24a, the combining section 24c, and the mapping section 24d are provided by installing an application program known as a logic synthesis tool or the like into a computer. The synthesis-parameter setting section 24b is configured to change a synthesis parameter regarding logic synthesis of the logic synthesis tool. The synthesis parameter is used to specify conditions when the arithmetic operation circuits L1 to L3 are formed in the FPGA 10, and the conditions regarding the combination of the circuit blocks can be changed by this synthesis parameter.

The logic synthesis section 24a performs logic synthesis that generates a net list from the circuit description information 26. The net list describes the route connecting between the circuit blocks, or the like. The synthesis-parameter setting section 24b sets parameter sets $P_0$ to $P_3$ when the logic synthesis section 24a performs the logic synthesis. The parameter set $P_0$ is a set of a plurality of synthesis parameters that are set so as to optimize a combination of the circuit blocks in the verification circuit 21. This parameter set $P_0$ is used when a net list $N_0$ for the verification circuit 21 is generated from the verification circuit description information 26a.

The parameter sets $P_1$ to $P_3$ each are a set of the plurality of synthesis parameters used to embody the arithmetic operation circuit description information 26b in the combination of the circuit blocks. These parameter sets $P_1$ to $P_3$ are different in some settings of synthesis parameters to form the arithmetic operation circuits L1 to L3 that are different from each other in combination of the circuit blocks as described above based on the same arithmetic operation circuit description information 26b.

In the present embodiment, the parameter sets $P_1$ to $P_3$ each include a synthesis parameter regarding the use of the DSP block 12 (hereinafter referred to as a "DSP parameter"), and a synthesis parameter regarding the data hold memory (hereinafter referred to as a "memory parameter"), and are different in combination of these parameter setting values.

The parameter set $P_1$ is used to generate a net list $N_1$ for the arithmetic operation circuit L1. The DSP parameter of the parameter set $P_1$ is set to make the maximum use of the DSP block 12. The memory parameter of the parameter set $P_1$ is set to use the block RAM 13 as the data hold memory. The parameter set $P_2$ is used to generate a net list $N_2$ for the arithmetic operation circuit L2. The DSP parameter of the parameter set $P_2$ is set not to use the DSP block 12, and the memory parameter of the parameter set $P_2$ is set to use the block RAM 13 as the data hold memory. The parameter set $P_3$ is used to generate a net list $N_3$ for the arithmetic operation circuit L3. The DSP parameter of the parameter set $P_3$ is set to make the maximum use of the DSP block 12, and the memory parameter of the parameter set $P_3$ is set to use the distributed RAM as the data hold memory.

The synthesis-parameter setting section 24b sets the parameter sets $P_1$ to $P_3$ to the logic synthesis section 24a when the logic synthesis section 24a performs the logic synthesis for the arithmetic operation circuits L1 to L3 as described above, thereby providing the conditions regarding the combination of the circuit blocks (resources of the FPGA) for forming each of the arithmetic operation circuits L1 to L3, and providing the diversity for the arithmetic operation circuits L1 to L3 that are different from each other in combination of the circuit blocks of the arithmetic operation circuits L1 to L3.

The logic synthesis section 24a performs the logic synthesis under the synthesis parameter set $P_0$ to generate the net list $N_0$ from the verification circuit description information 26a. The logic synthesis section 24a performs the logic synthesis using the arithmetic operation circuit description information 26b under each of the synthesis parameter sets $P_1$ to $P_3$ to generate the net lists $N_1$ to $N_3$.

Note that since the arithmetic operation circuits L1 to L3 are different from each other in combination of the circuit blocks, output timings of the arithmetic operation result data V1 to V3 may be different even when the input data X is input among the arithmetic operation circuits L1 to L3 at the same timing. In such case, a delay circuit, for example, may be formed so that the arithmetic operation result data V1 to V3 are input to the verification circuit 21 at the same timing.

The combining section 24c combines four net lists $N_0$ to $N_3$ obtained from the logic synthesis section 24a into one net list. When combining in such a manner, the combining section 24c generates a net list so that three output terminals indicated in the net lists $N_1$ to $N_3$ are connected to three input terminals indicated in the net list $N_0$.

The mapping section 24d performs so-called mapping (placement and routing) so that connections indicated in the net list are assigned to the circuit blocks and input and output pins in the FPGA 10 in accordance with the net list obtained from the combining section 24c. The mapping section 24d outputs the mapped information as the configuration information 18 to the configuration memory 16 in the FPGA 10. The configuration information 18 includes verification circuit configuration information $C_0$ for forming the verification circuit 21, and arithmetic operation circuit configuration information $C_1$ to $C_3$ for forming the arithmetic operation circuits L1 to L3, respectively.

Next, the functions of the above configuration will be described. The verification circuit description information 26a and the arithmetic operation circuit description information 26b common to the arithmetic operation circuits L1 to L3 are prepared to generate the configuration information 18 in the configuration information generating device 24 based on the verification circuit description information 26a and the arithmetic operation circuit description information 26b. For example, the synthesis-parameter setting section 24b firstly set the parameter set $P_0$ to the logic synthesis section 24a. And then, the logic synthesis section 24a reads the verification circuit description information 26a, and performs the logic synthesis under the parameter set $P_0$ to generate the net list $N_0$ from the verification circuit description information 26a.

After the net list $N_0$ is generated, the synthesis-parameter setting section 24b sets the parameter set $P_1$ to the logic synthesis section 24a. And then, the logic synthesis section 24a reads the arithmetic operation circuit description information 26b, and performs the logic synthesis under the parameter set $P_1$ to generate the net list $N_1$ from the arithmetic operation circuit description information 26b. At this time, the DSP parameter of the parameter set $P_1$ is set to make the maximum use of the DSP block 12, and the memory parameter of the parameter set $P_1$ is set to use the block RAM 13 as the data hold memory. Accordingly, the arithmetic operation circuit description information 26b for achieving a predetermined arithmetic operation function is converted to the net list $N_1$ for combining the circuit blocks to make the maximum use of the DSP block 12 and use the block RAM 13 as the data hold memory under the parameter set $P_1$.

After the net list $N_1$ is generated, the synthesis-parameter setting section 24b sets the parameter set $P_2$ to the logic synthesis section 24a. And then, the logic synthesis section 24a reads the arithmetic operation circuit description information 26b, and performs the logic synthesis under the parameter set $P_2$ to generate the net list $N_2$ from the arithmetic operation circuit description information 26b. In a case of the parameter set P2, the DSP parameter is set not to use the DSP block 12, and the memory parameter is set to use the block RAM 13 as the data hold memory. Accordingly, the arithmetic operation circuit description information 26b for achieving a predetermined arithmetic operation function is converted to the net list $N_2$ for combining the circuit blocks not to use the DSP block 12 but to use the block RAM 13 as the data hold memory under the parameter set $P_2$.

Furthermore, after the net list $N_2$ is generated, the synthesis-parameter setting section 24b sets the parameter set $P_3$ to the logic synthesis section 24a. And then, the logic synthesis section 24a reads the arithmetic operation circuit description information 26b to generate the net list $N_3$ from the arithmetic operation circuit description information 26b under the parameter set $P_3$. In such case, the DSP parameter is set to make the maximum use of the DSP block 12, and the memory parameter is set to use the distributed RAM as the data hold memory. Accordingly, the arithmetic operation circuit description information 26b for achieving a predetermined arithmetic operation function is converted to the net list $N_3$ for combining the circuit blocks to make the maximum use of the DSP block 12 and use the distributed RAM as the data hold memory under the parameter set $P_3$.

The net lists $N_0$ to $N_3$ are generated as described above, and then the combining section 24c combines these net lists $N_0$ to $N_3$ into one net list. Subsequently, the net list obtained from the combining section 24c is mapped by the mapping section 24d, and is output as the configuration information 18.

The configuration information 18 obtained from the mapping section 24d is loaded into the configuration memory 16 in the FPGA 10. When the configuration information 18 is loaded into the configuration memory 16, the arithmetic operation circuits L1 to L3 and the verification circuit 21 are formed in the FPGA 10. The arithmetic operation circuits L1 to L3 have the same arithmetic operation function, but are different from each other in combination of the circuit blocks. As described above, the arithmetic operation circuits L1, L3 are formed by combining the circuit blocks to make the maximum use of the DSP block 12, while the arithmetic operation circuit L2 is formed by combining the circuit blocks other than DSP block 12. The arithmetic operation circuits L1, L2 each are formed by combining the circuit blocks to use the block RAM 13 as the data hold memory, while the arithmetic operation circuit L3 is formed by combining the circuit blocks to use the distributed RAM as the data hold memory.

As described above, in the configuration information generating device 24, the logic synthesis is performed under each of the parameter sets $P_1$ to $P_3$ (synthesis parameters) each time each of the synthesis parameters is set, to generate the net lists $N_1$ to $N_3$ corresponding to the arithmetic operation circuits L1 to L3 from the same arithmetic operation circuit description information 26b, and generate the configuration information 18 including the arithmetic operation circuit configuration information $C_1$ to $C_3$ using the net lists $N_1$ to $N_3$. This enables the configuration information 18 for the plurality of arithmetic operation circuits L1 to L3 to be easily generated while holding the identity of the arithmetic operation function, the plurality of arithmetic operation circuits L1 to L3 being different from each other in combination of the circuit blocks, and enables the arithmetic operation circuits L1 to L3 to be easily formed in the FPGA 10 by applying the configuration information 18, the arithmetic operation circuits L1 to L3 having the same arithmetic function and being different from each other in combination of the circuit blocks.

The input data X is input to the FPGA 10 in which the arithmetic operation circuits L1 to L3 and the verification circuit 21 are formed as described above, and then the input data X is input to each of the arithmetic operation circuits L1 to L3. The input data X is input to the arithmetic operation circuit L1, and then the arithmetic operation circuit L1 performs the arithmetic operation with respect to the input data X, and outputs the resulting arithmetic operation result data V1 to the verification circuit 21. Similarly, the arithmetic operation circuits L2, L3 each perform the arithmetic operation with respect to the input data X, and output the resulting arithmetic operation result data V2, V3 to the verification circuit 21, respectively. The arithmetic operations are performed by the arithmetic operation circuits L1 to L3 to achieve specific arithmetic operation functions indicated by the arithmetic operation circuit description information 26b. In this way, in the FPGA 10, the plurality of arithmetic operation result data V1 to V3 are generated with respect to one input data X, and are input to the verification circuit 21.

The verification circuit 21 compares the arithmetic operation result data V1 to V3 each time the arithmetic operation result data V1 to V3 are input to the verification circuit 21 as described above. In case the arithmetic operation result data V1 to V3 are all coincident with each other, the verification circuit 21 outputs any one of the arithmetic operation result data V1 to V3 as the output data Y to the system controller. The verification circuit 21 generates the individual verification data R1 to R3 indicating that the arithmetic operation result data V1 to V3 do not differ from the output data Y in each bit, and are the same as each other, and outputs the verification data R including these individual verification data R1 to R3 to the system controller.

On the other hand, in case two of the arithmetic operation result data V1 to V3 are coincident with each other, the verification circuit 21 outputs one of the two arithmetic operation result data that are coincident with each other as the output data Y to the system controller. For example, in case the arithmetic operation result data V1, V3 are coincident with each other but are not coincident with the arithmetic operation result data V2, one of the arithmetic operation result data V1, V3 is output as the output data Y from the verification circuit 21 to the system controller. At this time, the verification circuit 21 generates the individual verification data R1, R3 indicating that the arithmetic operation result data V1, V3 are the same as the output data Y, generates the individual verification data R2 having information indicating that the arithmetic operation result data V2 differs from the output data Y and which bit of the arithmetic operation result data V2 differs from that of the output data Y, and outputs the verification data R including these individual verification data R1 to R3 to the system controller.

Note that in case the arithmetic operation result data V1 to V3 are not all coincident, the verification circuit 21 outputs, for example, a specified value as the output data Y to the system controller. In this case, the verification circuit 21 generates the individual verification data R1 to R3 indicating that the arithmetic operation result data V1 to V3 are not all coincident, and outputs the verification data R including these individual verification data R1 to R3 to the system controller.

In the conventional FPGA, a plurality of arithmetic operation circuits having the same arithmetic operation function and each being formed by combining the same circuit blocks are formed to perform an error verification. Therefore, in cases where an error occurs in each arithmetic operation circuit due to common factors such as the temperature fluctuation, the voltage fluctuation, and the clock fluctuation that are common to the plurality of arithmetic operation circuits, the operating state in each arithmetic operation circuit with respect to the common factors is the same, and the occurrence state of an error in each arithmetic operation circuit is the same. Therefore, in the conventional error verification method of an FPGA, since each arithmetic operation circuit generates the same arithmetic operation result data, the arithmetic operation result data are all coincident with each other, which increases difficulty of detecting the error occurrence.

In the FPGA 10 of the present embodiment, the arithmetic operation circuits L1 to L3 have the same arithmetic operation function, but are different from each other in combination of the circuit blocks included in each of the arithmetic operation circuits L1 to L3. Therefore, the operating state of each of the arithmetic operation circuits L1 to L3 with respect to the common factors varies, and the error occurrence state in each of the arithmetic operation circuits L1 to L3 also varies. In the FPGA 10, even when errors occur, for example, due to the common factors common to the arithmetic operation circuits L1 to L3 or for any reason, the possibility that the arithmetic operation circuits L1 to L3 simultaneously generate the same arithmetic operation result data V1 to V3 is reduced, and the possibility that the arithmetic operation result data V1 to V3 are not coincident becomes extremely higher. Accordingly, in the FPGA 10, the errors can be detected based on a determination result of the verification circuit 21 that the arithmetic operation result data V1 to V3 are not coincident.

In the FPGA 10, depending on the common factors, errors may occur in all of the arithmetic operation circuits L1 to L3 as described above, or errors may occur in one or two of the arithmetic operation circuits L1 to L3 and no error may occur in the remaining of them because the arithmetic operation circuits L1 to L3 are different from each other in combination of the circuit blocks included in each of the arithmetic operation circuits L1 to L3. Even in such a case, in the FPGA 10, the arithmetic operation circuits L1 to L3 do not simultaneously generate the same arithmetic operation result data V1 to V3. Therefore, the arithmetic operation result data V1 to V3 are not coincident, and the errors can be detected by the verification circuit 21 based on the result.

Factors causing errors in the arithmetic operation circuits L1 to L3 are various, and errors may occur due to factors other than the common factors. However, the arithmetic operation circuits L1 to L3 in the FPGA 10 are different from each other in combination of the circuit blocks as described above. Even when errors simultaneously occurs in the arithmetic operation circuits L1 to L3, the possibility that the arithmetic operation circuits L1 to L3 simultaneously generate the same arithmetic operation result data V1 to V3 is reduced. Accordingly, in the FPGA 10, the errors can be detected based on a determination result of the verification circuit 21 that the arithmetic operation result data V1 to V3 are not coincident.

The error detection rate based on the arithmetic operation result data V1 to V3 from the plurality of arithmetic operation circuits L1 to L3 having the same arithmetic operation function and the diversity to be different from each other in combination of the circuit blocks is higher than that of a plurality of conventional redundant arithmetic operation circuits having the same arithmetic operation function and being formed by combining the same circuit blocks.

Note that the above-described embodiment describes a configuration in which three arithmetic operation circuits L1 to L3 are formed, but the present invention is not limited to the configuration. As long as at least two arithmetic operation circuits can be formed, other various arithmetic operation circuits may be formed.

An aspect providing the plurality of arithmetic operation circuits L1 to L3 that are different from each other in combination of the circuit blocks is described above as an example, and is not limited to the above-described aspect. In case the number of arithmetic operation circuits is two, for example, a difference between the arithmetic operation circuit L1 and the arithmetic operation circuit L2 may be only the use of the DSP block 12. The number of DSP blocks 12 used for each of the arithmetic operation circuits L1 to L3, and the ratio of the number of DSP blocks 12 to the total number of the circuit blocks included in the arithmetic operation circuits L1 to L3 may be different from those of the above aspect. Not only the DSP block 12 but also the use, the number, the ratio and the like of specific hard macros such as a multiplier may be different from those of the above aspect.

In the above embodiment, the verification circuit 21 is formed in the FPGA 10, but the arithmetic operation result data of each of the arithmetic operation circuits L1 to L3 may be directly output from the FPGA 10 to an external apparatus without forming the verification circuit 21 in the FPGA 10. In this case, the external apparatus may perform the verification similar to the verification of the verification circuit 21. A method for determining the output data Y by the verification circuit 21 is described as an example. For example, the maximum value of the arithmetic operation result data may be regarded as the output data Y (high value selection). On the contrary, a small value of the arithmetic operation result data may be regarded as the output data Y (low value selection). An average value or an intermediate value of the arithmetic operation result data may be regarded as the output data Y, or a value of the arithmetic operation result data exceeding a fixed value, for example, a majority may be regarded as the output data Y (conditional majority). The distribution of the arithmetic operation result data values is calculated, and the output data Y may be determined from the arithmetic operation result data in a range excluding the outside of a particular deviation range by a method of the high value selection, the low value selection, the average value, the intermediate value, the majority, the conditional majority or the like. The output data Y may be determined by combining with the above methods. Note that in the case of the conditional majority, a specified value may be output as the output data Y when there is no arithmetic operation result data exceeding a fixed value.

The majority, the conditional majority or the like may be taken among corresponding bits among arithmetic operation result data to assign the selected bit value to a bit of the output data Y. A reference bit string is generated by taking the majority, the conditional majority or the like among corresponding bits among arithmetic operation result data to compare corresponding bits between the reference bit string and the bit string of the arithmetic operation result data. The arithmetic operation result data with the smallest difference may be regarded as the output data Y.

[Verification]

Next, a verification test was performed with a simulation tool (application program) of the FPGA regarding the improvement of the error detection rate in the FPGA 10 of the present invention. In this verification test, the error detection rate was verified based on the arithmetic operation result data V1, V2 obtained from the two arithmetic operation circuits L1, L2 having the same arithmetic operation function and being different from each other in combination of the circuit blocks that are formed in the FPGA 10 by performing the timing simulation of the FPGA as a verification example.

In the verification example, the FBD language was mounted on a plant control device, and the arithmetic operation circuit description information in Verilog HDL was generated by performing the high-level synthesis of behavioral description information of multiplying function described in the FBD language that is a control description language conforming to IEC-61131. The logic synthesis was performed using two different sets of parameter sets based on one of arithmetic operation circuit description information thus generated, to generate the net lists $N_1$, $N_2$ corresponding to two arithmetic operation circuits L1, L2. The net lists $N_1$, $N_2$ were combined into one net list, and the configuration information 18 was obtained by mapping based the net list. In the verification example, the timing simulation was performed on the simulation tool using the configuration information 18, the propagation delay information of the FPGA 10 and the like to be simulated. ISE (R) 14.7 (made by Xilinx, Inc.) was used for the processes from the logic synthesis to the mapping, and the timing simulation. The timing simulation was performed assuming XC7K325T-2 (Kintex-7, made by Xilinx, Inc.) as the FPGA 10.

The arithmetic operation circuits L1, L2 in the verification example multiplies two input values (integer) as the arithmetic operation. The two input values were generated with random numbers, and were input as one input data X to the arithmetic operation circuits L1, L2, respectively. Each of the arithmetic operation result data V1, V2 obtained from the arithmetic operation circuits L1, L2 was 32 bits.

In the logic synthesis for generating the net list $N_1$, the DSP parameter set to make the maximum use of the DSP block 12 was used. In the logic synthesis for generating the net list $N_2$, the DSP parameter set not to use the DSP block 12 was used. Note that the net lists $N_1$, $N_2$ were generated without particularly setting the synthesis parameters other than the DSP parameter. The arithmetic operation circuit L1 in the verification example was circuit configured to make the maximum use of the DSP block 12. On the other hand, the arithmetic operation circuit L2 in the verification example was circuit configured to combine the circuit blocks other than the DSP block 12. Here, the use states of the circuit blocks in each of the arithmetic operation circuits L1, L2 in the verification example are shown in Table 1. Note that in Table 1, the use states of the circuit blocks are shown for reference when the arithmetic operation circuits L1, L2 perform the proportional integration using the same synthesis parameters as another verification example.

The following indicates the meaning of each item in a column "PHYSICAL PARAMETER OF FPGA" in Table 1.
[Slice Logic Utilization]
(1) Number of Slice Registers: the number of registers used in a slice (or slices)
(2) Number used as Flip Flops: the number of registers used as flip flops, of the number of registers of (1)
(3) Number of Slice LUTs: the number of LUTs used in a slice (or slices)
(4) Number used as logic: the number of LUTs used to achieve the logic function, of the number of LUTs of (3) (LUT has O6 output and O5 output)
(5) Number using O6 output only: the number of LUTs using O6 output only, of the number of LUTs of (4)
(6) Number using O5 output only: the number of LUTs using O5 output only, of the number of LUTs of (4)
(7) Number using O5 and O6: the number of LUTs using both O6 output and O5 output, of the number of LUTs of (4)
(8) Number used exclusive as route-thrus: the number of LUTs used exclusive as route-through (only for the route connecting input to register or the like), of the number of LUTs of (3)
(9) Number with same-slice carry load: the number of LUTs as carry signal line (connected in a slice), of the number of LUTs of (8)
[Slice Logic Distribution]
(10) Number of occupied Slices: the number of slices used in the arithmetic operation circuit
(11) Number of LUT Flip Flop pairs used: the number of pairs of LUT and flip flop actually used, the LUT and flip flop being included in the slice (or slices) of (10)
(12) Number with an unused Flip Flop: the number of unused flip flops, of the pairs of (11)
(13) Number with an unused LUT: the number of unused LUTs of the pairs of (11)
(14) Number of fully used LUT-FF pairs: the number of used pairs of LUT and flip flop, of the pairs of (11)
[Specific Feature Utilization]
(15) Number of DSP48E1s: the number of DSP blocks 12 to be used

TABLE 1

| PHYSICAL PARAMETER OF FPGA | Multiplication Arithmetic operation circuit | | Proportional integration Arithmetic operation circuit | |
|---|---|---|---|---|
| | L1 | L2 | L1 | L2 |
| Slice Logic Utilization | | | | |
| Number of Slice Registers | 0 | 0 | 65 | 96 |
| Number used as Flip Flops | 0 | 0 | 65 | 96 |
| Number of Slice LUTs | 38 | 1203 | 126 | 3049 |
| Number used as logic | 38 | 1199 | 126 | 3041 |
| Number using O6 output only | 38 | 590 | 110 | 2243 |
| Number using O5 output only | 0 | 51 | 0 | 102 |
| Number using O5 and O6 | 0 | 558 | 16 | 696 |
| Number used exclusively as route-thrus | 0 | 4 | 0 | 8 |
| Number with same-slice carry load | 0 | 4 | 0 | 8 |
| Slice Logic Distribution | | | | |
| NIumber of occupied Slices | 24 | 316 | 43 | 877 |
| Number of LUT Flip Flop pairs used | 38 | 1203 | 127 | 3049 |
| Number with an unused Flip Flop | 38 | 1203 | 63 | 2968 |
| Number with an unused LUT | 0 | 0 | 1 | 0 |
| Number of fully used LUT-FF pairs | 0 | 0 | 63 | 81 |
| Specific Feature Utilization | | | | |
| Number of DSP48E1s | 4 | 0 | 9 | 0 |
| Average Fanout of Non-Clock Nets | 1.61 | 2.68 | 1.75 | 3.18 |

(16) Average Fanout of Non-Clock Nets: average fanout of routes other than clock (the average number of branches of one signal line)

Note that the "slice" is a basic circuit constituting the above basic configuration block, and the LUT and the register (flip flop) are basic elements.

In the verification test, it was assumed that the error occurrence state in the actual environment was similar to the state in which the operation frequency of the FPGA 10 was fluctuated. Specifically, the state similar to the state in which the propagation delay of a signal occurred between the circuit blocks due to the temperature fluctuation and the voltage fluctuation was created by changing the operation frequency of the FPGA 10 on the simulation. In the timing simulation of the verification example, the operation frequency was changed from 160 MHz to 258 MHz by 2 MHz. At each operation frequency, the arithmetic operation circuits L1, L2 performed the multiplication arithmetic operation.

At each operation frequency, 10000 pieces of input data X were input to each of the arithmetic operation circuits L1, L2, and each of the arithmetic operation circuits L1, L2 performed the multiplication arithmetic operation 10000 times. The arithmetic operation result data V1, V2 output from the arithmetic operation circuits L1, L2 with respect to one input data X were input to a program different from the simulation tool to verify the error occurrence state and the like.

Figure 4:
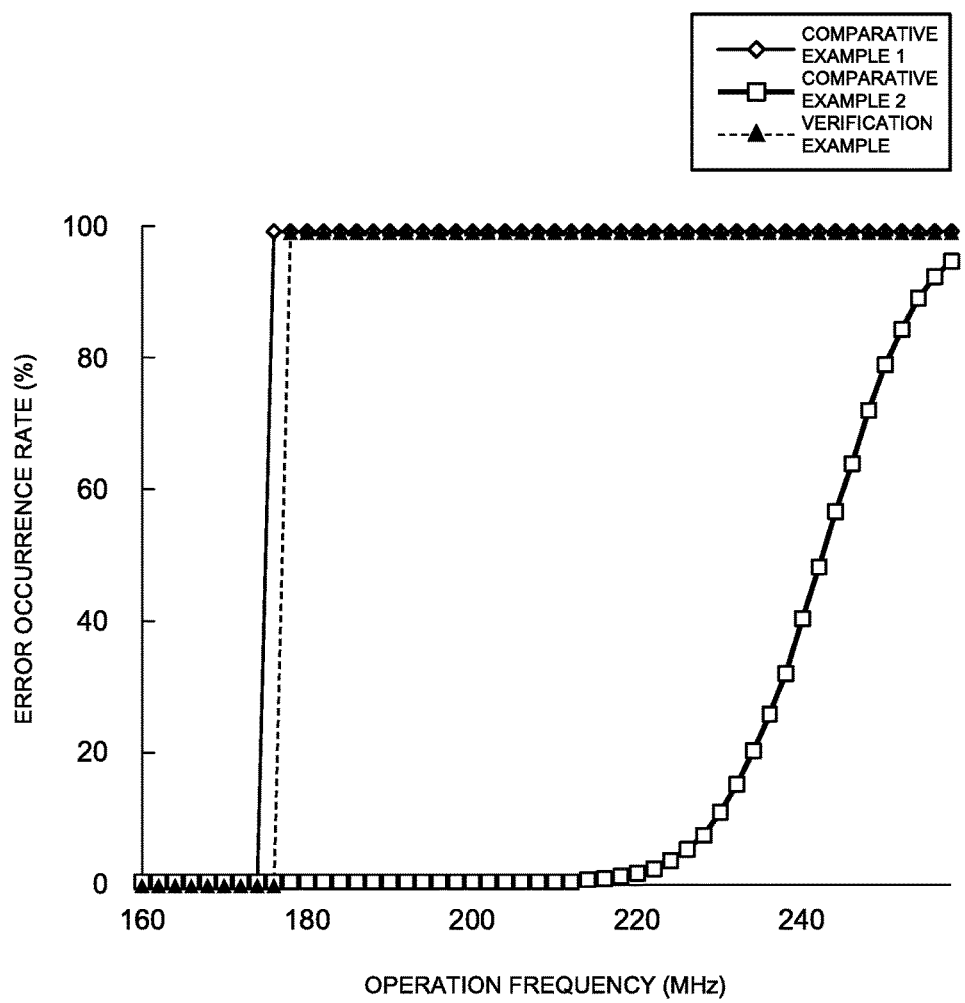
FIG. 4 is a graph showing a relationship between an operation frequency and an error occurrence rate in a verification example and comparative examples.

FIG. 4 shows a relationship between the error occurrence rate and the operation frequency in the above verification example. In FIG. 4, the abscissa of the graph indicates the operation frequency of the FPGA 10, and the ordinate indicates the error occurrence rate. In one-time input of the input data X, when at least one of the arithmetic operation result data V1, V2 is a wrong value, the number of times of error occurrence is counted as one time, and the error occurrence rate is a rate (%) of the number of times of error occurrence to the total number of inputs of the input data X (10000 times) at each operation frequency. Whether the arithmetic operation result data V1, V2 are wrong values was determined by comparing a true value separately calculated and the arithmetic operation result data V1, V2.

Figure 5:
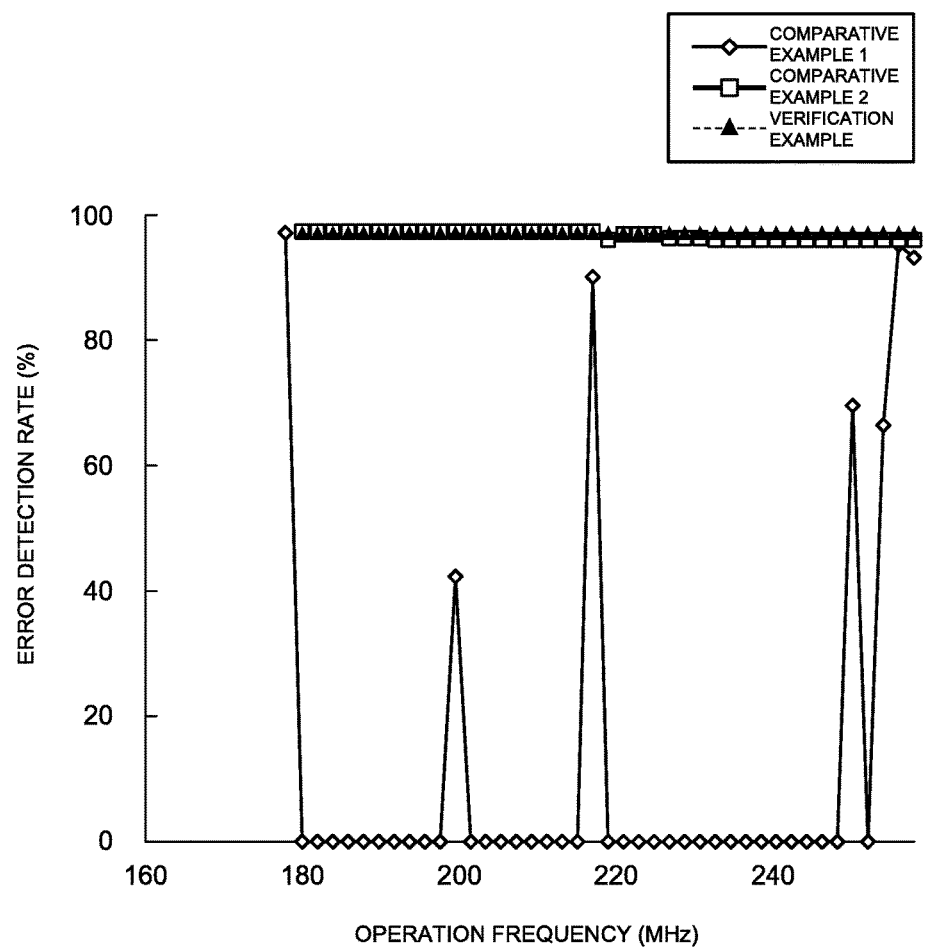
FIG. 5 is a graph showing a relationship between an operation frequency and an error detection rate in a verification example and comparative examples.

FIG. 5 shows the error detection rate when the arithmetic operation result data V1, V2 are not coincident. In FIG. 5, the abscissa of the graph indicates the operation frequency of the FPGA 10, and the ordinate indicates the error detection rate. In one-time input of the input data X, when the arithmetic operation result data V1, V2 are not coincident, the number of times of error detection is counted as one time, and the error detection rate is a rate (%) of the number of times of error detection to the total number of inputs of the input data X (10000 times) at each operation frequency. Note that FIG. 5 shows verification results at the operation frequency of 178 MHz or more at which errors were detected in Comparative Example 1 described later.

Figure 6:
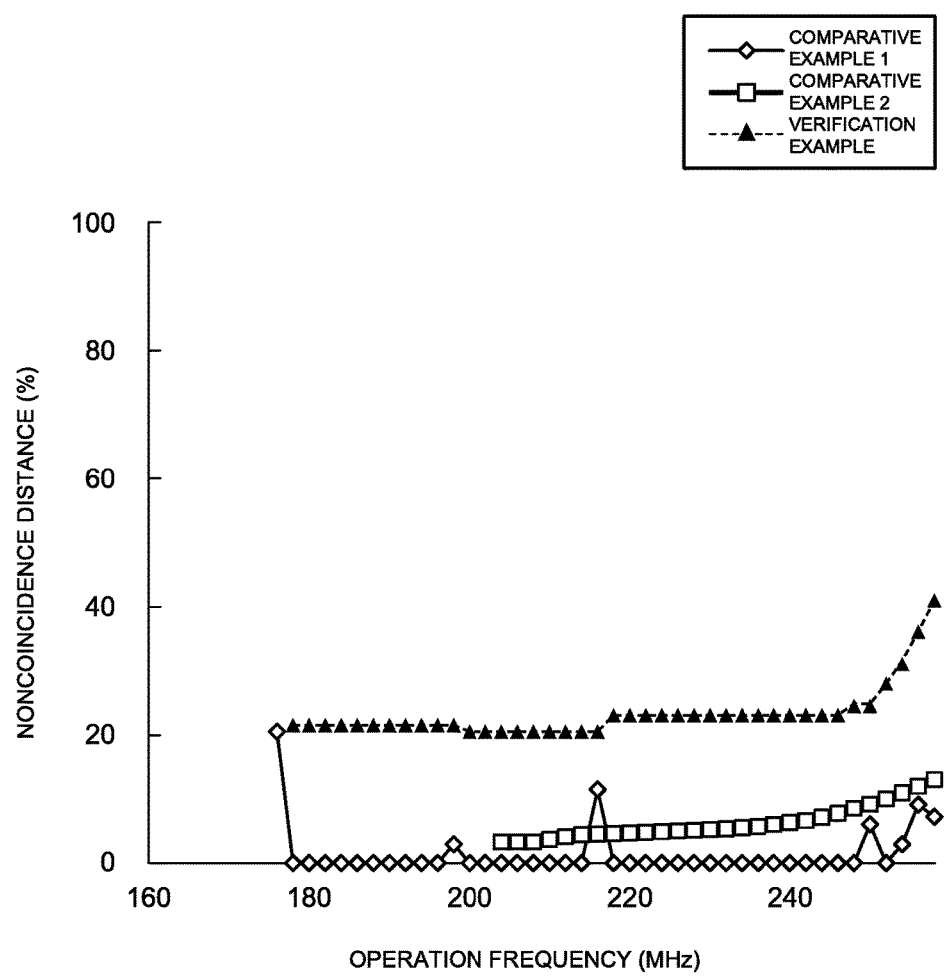
FIG. 6 is a graph showing a relationship between an operation frequency and a noncoincidence distance between the arithmetic operation results in a verification example and comparative examples.

FIG. 6 shows difference distances between the arithmetic operation result data V1, V2 (hereinafter referred to as a "noncoincidence distance"). The noncoincidence distance (D) is obtained by dividing the total number of error bits normalized to 32 bits by the number of times of error detection at each operation frequency as expressed by Expression 1, and is represented by the percentage. The noncoincidence distance becomes larger when a difference between the arithmetic operation result data V1, V2 is large.

[Expression 1]

$$D = \frac{\sum_{i=1}^{10^4} E(i, f)}{32 \times S(f)} \times 100 \ (\%) \quad (1)$$

A value E(i, f) in Expression 1 described above is the number of bits when the arithmetic operation result data V1, V2 are not coincident regarding the i-th input data X at the operation frequency f. Also, S(f) is the number of times of error detection at the operation frequency f.

In the verification test, to compare with the verification example, the timing simulation of the FPGA in which two arithmetic operation circuits L1 formed to make the maximum use of the DSP block 12 are provided is performed as Comparative Example 1, and the timing simulation of the FPGA in which two arithmetic operation circuits L2 formed by combining the circuit blocks other than the DSP block 12 are provided is performed as Comparative Example 2. In the FPGAs in Comparative Example 1 and Comparative Example 2, the configuration information for forming each of the arithmetic operation circuits L1 and L2 was generated in the same manner as the verification example. In each of Comparative Example 1 and Comparative Example 2, the timing simulation was performed on the simulation tool in the same manner as the verification example. The verification results of Comparative Example 1 and Comparative Example 2 are shown in FIG. 4 to FIG. 6.

As shown in FIG. 4, in Comparative Example 1 in which the two arithmetic operation circuits L1 formed by using the DSP block 12 were provided, the error occurrence rate was about 100% at the operation frequency above 176 MHz. In Comparative Example 2 in which the two arithmetic operation circuits L2 formed without using the DSP block 12 were provided, errors occurred at the operation frequency above 204 MHz. As the operation frequency increased, the error occurrence rate increased to be 100%. It is found that the error occurrence states are different from each other in combination of the circuit blocks. In the verification example to which the present invention is applied, the error occurrence rate was about 100% at the operation frequency above 178 MHz, and the error occurrence state is the same as that of Comparative Example 1.

In Comparative Example 1, it is found that the arithmetic operation result data output from at least one of the two arithmetic operation circuits L1 is a wrong value in the operation frequency of 178 MHz or more. However, as shown in FIG. 5, in Comparative Example 1, errors are detected at some operation frequencies of 178 MHz or more, but errors are not detected at the other operation frequencies. Since the two arithmetic operation circuits L1 formed by combining the same circuit blocks are used in Comparative Example 1, the same errors occur in two arithmetic operation circus L1, resulting in outputting the same arithmetic operation result data, respectively. As a result, it cannot be detected as an error. In Comparative Example 2, the error detection rate is about 100%, but the error detection rate is reduced by 1 to 2% at the operation frequency above 218 MHz.

The error detection rate in the verification example of the present invention was about 100% at all of the operation frequencies. That is, as compared with a configuration in which a plurality of redundant arithmetic operation circuits having the same combination of circuit blocks are formed as in Comparative Example 1 and Comparative Example 2, a configuration in which a plurality of arithmetic operation circuits L1, L2 having the different combination of circuit blocks, that is, having the diversity are formed as in the verification example of the present invention enables errors to be detected more surely, thereby improving the error detection rate. As shown in FIG. 6, the noncoincidence distance in the verification example is larger by three or more times than that in Comparative Example 1 and Comparative Example 2. That is, as compared with a configuration in which a plurality of redundant arithmetic operation circuits having the same circuit configuration are formed as in Comparative Example 1 and Comparative Example 2, when a plurality of arithmetic operation circuits that are different from each other in combination of circuit blocks, that is, having the diversity are formed as in the verification example of the present invention, the higher error detection capability can be obtained.

REFERENCE SIGNS LIST

10 FPGA (programmable logic device)
11 Basic logic block
12 DSP block
21 Verification circuit
L1 to L3 Arithmetic operation circuit

The invention claimed is:

1. A method for verifying an error of a programmable logic device capable of changing an arithmetic operation function by changing a combination of a plurality of circuit blocks, the method comprising:
 a circuit forming step of (a) generating a plurality of net lists corresponding to a plurality of arithmetic operation circuits from same arithmetic operation circuit description information described in a hardware description language by performing logic synthesis using a plurality of synthesis parameters that is different in condition regarding the combination of the plurality of circuit blocks, and (b) writing configuration information generated from the plurality of net lists into the programmable logic device to form the plurality of arithmetic operation circuits that corresponds to the plurality of net lists, shares the arithmetic operation function, differs in the combination of the plurality of circuit blocks, and differs in connection states of the plurality of circuit blocks;
 an arithmetic operation step of performing an arithmetic operation by each of the plurality of arithmetic operation circuits; and
 a verification step of verifying arithmetic operation results from the plurality of arithmetic operation circuits by a verification circuit.

2. The method for verifying an error of a programmable logic device according to claim 1, wherein
 the circuit forming step includes:
  (c) forming at least one first arithmetic operation circuit of the plurality of arithmetic operation circuits, the at least one first arithmetic operation circuit having one combination of the plurality of circuit blocks including a DSP block as one of the plurality of circuit blocks; and
  (d) forming at least one second arithmetic operation circuit of the plurality of arithmetic operation circuits, the at least one second arithmetic operation circuit having another combination of the plurality of circuit blocks other than the DSP block.

3. A method for forming a circuit of a programmable logic device capable of changing an arithmetic operation function by changing a combination of a plurality of circuit blocks in accordance with configuration information, the method comprising:
 a synthesis-parameter setting step of sequentially setting synthesis parameters that are different in condition regarding the combination of the plurality of circuit blocks;
 a logic synthesis step of, each time one of the synthesis parameters is set in the synthesis-parameter setting step, performing logic synthesis under the one of the synthesis parameters to generate a plurality of net lists corresponding to a plurality of arithmetic operation circuits from the same arithmetic operation circuit description information described in a hardware description language;
 a configuration information generating step of generating the configuration information from the plurality of net lists; and
 a forming step of writing the configuration information into the programmable logic device to form, in the programmable logic device, the plurality of arithmetic operation circuits that corresponds to the plurality of net lists, shares the arithmetic operation function, differs in the combination of the plurality of circuit blocks, differs in connection states of the plurality of circuit blocks, and outputs arithmetic operation results to a verification circuit to verify the arithmetic operation results.

* * * * *